(12) United States Patent
Menon et al.

(10) Patent No.: US 10,049,963 B2
(45) Date of Patent: Aug. 14, 2018

(54) POWER ELECTRONICS MODULE

(71) Applicant: ROLLS-ROYCE plc, London (GB)

(72) Inventors: Kalyani G Menon, Derby (GB);
Richard Harwood, Derby (GB)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 15/465,234

(22) Filed: Mar. 21, 2017

(65) Prior Publication Data
US 2017/0301609 A1 Oct. 19, 2017

(30) Foreign Application Priority Data
Apr. 18, 2016 (GB) .................................. 1606708.4

(51) Int. Cl.
H01L 29/49 (2006.01)
H01L 23/473 (2006.01)
(Continued)

(52) U.S. Cl.
CPC .............. H01L 23/473 (2013.01); B64F 1/34 (2013.01); F02C 7/12 (2013.01); F02C 7/26 (2013.01); H01L 23/053 (2013.01); H01L 23/08 (2013.01); H01L 23/10 (2013.01); H01L 23/467 (2013.01); H01L 24/32 (2013.01); H01L 25/072 (2013.01); H01L 25/115 (2013.01); H02M 7/003 (2013.01); H05K 5/0247 (2013.01); H05K 5/03 (2013.01); H05K 5/061 (2013.01); H05K 7/20909 (2013.01); H05K 7/20927 (2013.01);
(Continued)

(58) Field of Classification Search
CPC ...... H01L 23/473; H01L 23/053; H01L 23/08
See application file for complete search history.

(56) References Cited

U.S. PATENT DOCUMENTS 6,973,801 B1 * 12/2005 Campbell ............. H01L 23/473
165/104.32
2001/0014029 A1 8/2001 Suzuki et al.
(Continued)

FOREIGN PATENT DOCUMENTS

JP 2009-206191 A 9/2009
WO 2013/118809 A1 8/2013
WO 2015/025582 A1 2/2015

OTHER PUBLICATIONS

Oct. 31, 2016 Search Report issued in British Patent Application No. 1606708.4.

Primary Examiner — Michael Shingleton
(74) Attorney, Agent, or Firm — Oliff PLC

(57) ABSTRACT

A power electronics module is provided having one or more power converter semiconductor components. The power electronics module further has a substrate having a first surface to which the one or more components are mounted, and having an opposing second surface from which project a plurality of heat transfer formations for enhancing heat transfer from the substrate. The power electronics module further has a coolant housing which sealingly connects to the substrate to form a void over the heat transfer formations of the second surface. The coolant housing has an inlet for directing a flow of an electrically insulating coolant into the void and an outlet for removing the coolant flow from the void, whereby heat generated during operation of the one or more components is transferred into the coolant flow via the substrate.

20 Claims, 1 Drawing Sheet

(51) Int. Cl.
| | |
|---|---|
| *H05K 7/20* | (2006.01) |
| *H01L 25/07* | (2006.01) |
| *H01L 23/467* | (2006.01) |
| *H01L 23/053* | (2006.01) |
| *H01L 23/10* | (2006.01) |
| *H05K 5/03* | (2006.01) |
| *H01L 25/11* | (2006.01) |
| *H01L 23/00* | (2006.01) |
| *H01L 23/08* | (2006.01) |
| *H05K 5/02* | (2006.01) |
| *H05K 5/06* | (2006.01) |
| *H02M 7/00* | (2006.01) |
| *F02C 7/26* | (2006.01) |
| *F02C 7/12* | (2006.01) |
| *B64F 1/34* | (2006.01) |

(52) U.S. Cl.
CPC .... *F05D 2220/323* (2013.01); *F05D 2260/85* (2013.01); *H01L 2224/32245* (2013.01); *H01L 2224/48091* (2013.01); *H01L 2224/48247* (2013.01); *H01L 2224/73265* (2013.01); *H01L 2224/8384* (2013.01); *H01L 2224/83801* (2013.01); *H01L 2924/15724* (2013.01); *H01L 2924/15747* (2013.01)

(56) References Cited

U.S. PATENT DOCUMENTS

| | | |
|---|---|---|
| 2008/0237847 A1 | 10/2008 | Nakanishi et al. |
| 2010/0232112 A1 | 9/2010 | Uechi et al. |
| 2010/0326626 A1* | 12/2010 | Schultz .............. H01L 23/473 165/80.4 |
| 2014/0168897 A1 | 6/2014 | Jaskari et al. |
| 2014/0347818 A1 | 11/2014 | Uhlemann et al. |
| 2014/0376184 A1 | 12/2014 | Gohara |

* cited by examiner

POWER ELECTRONICS MODULE

FIELD OF THE INVENTION

The present invention relates to a power electronics module.

BACKGROUND

Power electronic modules are typically used as the building blocks of power converters, such as inverters for the control of electric motors. For example, within an aircraft such modules may be used within a converter which powers an all-electric starter-generator. Power electronic modules may be used in a wide number of industries including transport where it may be used in hybrid electric systems for aero, marine and/or land based transport. They can also be used within power generation industries as well as civil and military infrastructure. The modules described herein are generally applicable to any industry that uses power electronics.

Power electronic modules are typically mounted to a heat sink in order to facilitate heat transfer away from the semiconductor components of the modules.

Conventionally, power electronic modules have a number of substrate layers between the semiconductor components and the outside environment. These layers provide mechanical support, electrical isolation, electrical connection, protection and thermal management of the components. Typically the heat flux generated from losses within the semiconductor is directed downwards, through the many layers, into a heat sink.

For example, a substrate for a module may be formed with a ceramic layer (e.g. AlN) sandwiched between two metal layers (e.g. Cu metallization layers). The bottom metal layer can then be soldered to a metal-matrix composite (e.g. Al—SiC) baseplate, which in turn is connected to the heat sink.

A problem arises, however, that the number of substrate layers within the module present a significant thermal resistance and therefore limit the power handling of the semiconductors or can cause unacceptable heat rises. Particularly problematic can be the thermal interface materials used to create thermal connections between layers. There can also be reliability issues due to degradation of these interfaces.

SUMMARY

It would be desirable to be able to reduce the number of substrate layers, thereby reducing resistance to heat flow, improving reliabilities, and potentially decreasing the overall weight of power electronic modules.

Accordingly, in a first aspect, the present invention provides a power electronics module having:
  one or more power converter semiconductor components;
  a substrate having a first surface to which the one or more components are mounted, and having an opposing second surface from which project a plurality of heat transfer formations for enhancing heat transfer from the substrate; and
  a coolant housing which sealingly connects to the substrate to form a void over the heat transfer formations of the second surface, the coolant housing having an inlet for directing a flow of an electrically insulating coolant into the void and an outlet for removing the coolant flow from the void, whereby heat generated during operation of the one or more components is transferred into the coolant flow via the substrate.

The one or more components may be directly mounted to the first surface without any thermal or insulating intermediary substrate.

By extracting heat from the semiconductor components into the coolant flow via a metal substrate (and especially via the heat transfer formations), efficient and reliable cooling of the components can be achieved while reducing the number of substrate layers.

In a second aspect, the present invention provides a plurality of power electronics modules according to the first aspect, each power electronics module having a respective substrate, a shared unitary coolant housing forming a plurality of respective voids over the heat transfer formations of the second surfaces of the substrates. The unitary coolant housing may be configured such that the coolant flows in series or in parallel between the voids from the inlet to the outlet.

In a third aspect, the present invention provides an electric starter-generator for an aircraft engine, the starter-generator having the power electronics module of the first aspect or the power electronics modules of the second aspect.

In a fourth aspect, the present invention provides an aircraft engine, such as a gas turbine engine, having the electric starter-generator of the third aspect.

Optional features of the invention will now be set out. These are applicable singly or in any combination with any aspect of the invention.

The substrate may be a single layer of material from the first surface to the second surface. By using a single layer rather than a multi-layer construction, resistance to heat flow can be reduced and interfacial degradation within the substrate avoided.

The coolant housing may be formed of an electrical insulator. Additionally or alternatively, the coolant housing may be sealingly connected to the substrate via an electrically insulating gasket which electrically isolates the housing from the substrate.

The power electronics module may further have a protective cover formed of an electrical insulator for the one or more components. For example, the protective cover may have electrical connectors extending from the outside of the cover to the one or more components. Such a protective cover can mediate the connection between the coolant housing and the substrate. For example, the protective cover may be sealingly connected to the substrate, and the coolant housing then sealingly connected to the cover.

Typically, the substrate is formed of material having a thermal conductivity of at east 100 $Wm^{-1}K^{-1}$ and preferably of at least 200 $Wm^{-1}K^{-1}$. The material of the substrate may be a metal or metal matrix composite, such as copper, aluminium, or aluminium-graphite metal matrix composite.

The heat transfer formations can be pins and/or fins. Preferably the heat transfer formations may be integral and homogeneously formed with the substrate. The formations may be manufactured by a material removal technique such as etching or mechanical machining of the substrate or by an additive technique such as powder bed or blown or wire deposition where material is applied to a pool of melted material formed on the second surface by a laser or other energy source. Where the heat transfer formations are made by additive manufacture their shape may be more complex and could include, for example, serpentine or wavy shapes plus hollow or perforated pins and/or fins, amongst others.

The one or more components may be soldered or sintered to the first surface of the substrate.

Areas of the first surface of the substrate surrounding the one or more components may have an electrically insulating coating. A metallisation coating may then be formed on the electrically insulating coating, e.g. to facilitate electrical connection between components using bond wires or planar interconnects.

The coolant may be an isolating (i.e. dielectric) fluid, such as dry air, mineral oil, silicone oil, benzene, or fluorinated ketone.

The coolant housing may be sealingly connected to the substrate around a perimeter of the void.

A pumping unit may be provided for circulating the coolant. A heat exchanger may be provided for cooling the coolant removed through the outlet.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
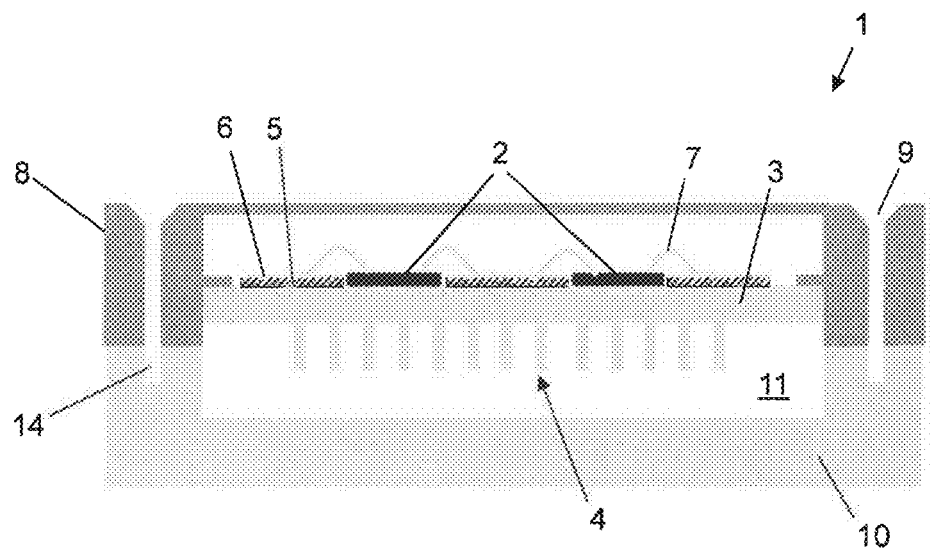
FIG. 1 shows a cross-section through part of a power electronics module.

FIG. 1 shows a cross-section through part of a power electronics module 1 having a plurality of power converter semiconductor components 2. These components are bonded to a top surface of a substrate 3, e.g. by soldering or sintering. The bottom surface of the substrate is covered in an array of pin or fin heat transfer structures 4, formed e.g. by machining or 3D printing. The pin or fins increase the substrate surface area and cause turbulence in a coolant flow (discussed below).

The substrate 3 is typically formed of a single layer of high thermal conductivity material, for example metal such as copper or aluminium, or metal matrix composite such as aluminium-graphite MMC. Avoiding the multi-layer construction of conventional substrates improves heat conduction away from the components 2, and reduces the number of potentially degradable interfaces.

The top surface of the substrate may be coated with a ceramic or dielectric material coating 5 in the areas around the semiconductor components 2. The ceramic or dielectric may in turn have a thin metallisation coating 6 to facilitate electrical connection between components using bond wires 7 or planar interconnects. The metallisation may be etched to allow specific interconnections to be formed.

The top surface of the substrate 3 is encased within a non-conductive protective cover or shell 8. The cover may contain electrical connections between the semiconductor components 2 and external parts of the module 1. The cover is impervious to the coolant and forms a fluid-tight seal to the substrate.

Figure 2:
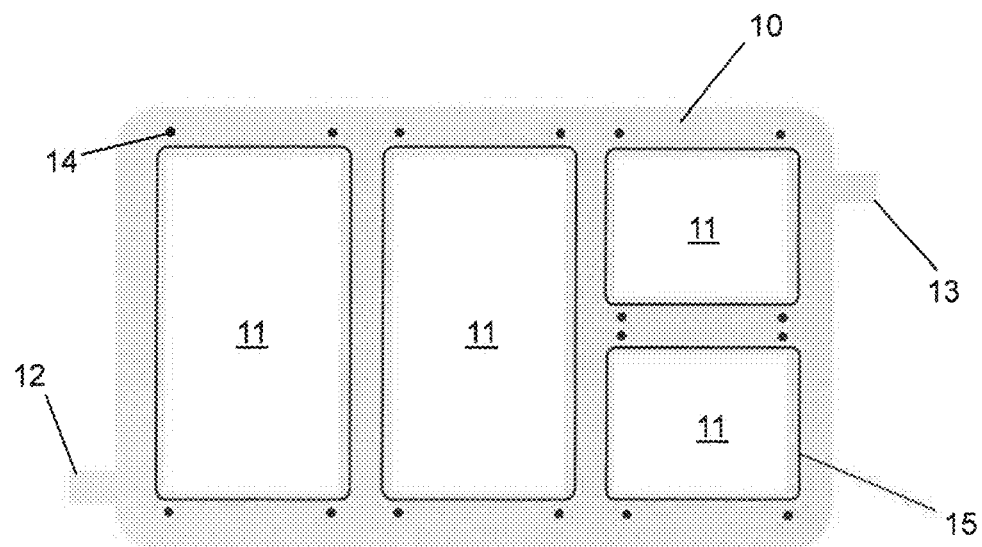
FIG. 2 shows a plan view of a coolant housing for such a module.

To guide and contain the coolant, the module 1 has a plate-like coolant housing 10 which forms a void 11 over the array of pins or fins 4 of the bottom surface of the substrate 3. FIG. 2 shows a plan view of such a housing which forms a plurality of voids 11 for respective substrates 3 of plural modules 1, i.e. in FIG. 2 a single unitary housing is shared by the modules. An inlet 12 guides a flow of a coolant into the voids, and an outlet 13 removes the coolant flow from the voids. The housing can be configured so that the coolant flows in series or in parallel through the voids from the inlet to the outlet. For example, the order of flow through the voids can be optimised based on e.g. the types of components 2 to be cooled. The housing can electrically isolate the modules from each other, as well as facilitating mounting into a converter structure, e.g. of an electric starter-generator of an aircraft engine. The housing allows modules to be swapped during service and may contain one or more modules depending on converter requirements.

The cover 8 may have bolt holes 9 to facilitate mounting and/or other fastening formations for e.g. clips. The bolt holes 9 can also be used to join the cover to the coolant housing 10 via corresponding bolt holes 14 in the housing. Gaskets 15 may be provided at the cover/housing interface to form fluid-tight seals around the voids 11 and thereby prevent leakage of the coolant.

To provide electrical isolation, the coolant is electrically insulating, and can be, for example, dry air, mineral oil, silicone oil, benzene, or fluorinated ketone such as Novec™ (available from 3M). Moreover, the cover 8 and the housing 10 can be formed of electrical insulator (i.e. dielectric material). The gaskets 15, which may be formed of rubber, can also be used to electrically isolate the housing 10 from the cover 8 and thence from the substrate 3. Indeed, such an arrangement can allow the housing 10 to be formed of non-electrical insulator, although it may then be necessary to take other precautions such as using electrically insulating fasteners to join the cover to the housing.

While the invention has been described in conjunction with the exemplary embodiments described above, many equivalent modifications and variations will be apparent to those skilled in the art when given this disclosure. For example, the power electronics module could be used in any power electronic circuit or system where power density is a concern. As well as aerospace, automotive, land and sea applications are also possible. Accordingly, the exemplary embodiments of the invention set forth above are considered to be illustrative and not limiting. Various changes to the described embodiments may be made without departing from the spirit and scope of the invention.

The invention claimed is:

1. A power electronics module having:
   one or more power converter semiconductor components;
   a substrate having a first surface to which the one or more components are mounted, and having an opposing second surface from which project a plurality of heat transfer formations for enhancing heat transfer from the substrate; and
   a coolant housing which defines with the substrate a void over the heat transfer formations of the second surface, the coolant housing having an inlet for directing a flow of an electrically insulating coolant into the void and an outlet for removing the coolant flow from the void, whereby heat generated during operation of the one or more components is transferred into the coolant flow via the substrate;
   wherein the substrate is a single layer of metallic or metal matrix composite material from the first surface to the second surface.

2. A power electronics module according to claim 1, wherein the one or more components are directly mounted to the first surface.

3. A power electronics module according to claim 2, wherein the coolant housing is formed of an electrical insulator.

4. A power electronics module according to claim 2, wherein the coolant housing connected to the substrate via an electrically insulating gasket which electrically isolates the housing from the substrate.

5. A power electronics module according to claim 2, further having a protective cover formed of an electrical insulator for the one or more components, the protective cover having electrical connectors extending from the outside of the cover to the one or more components-.

6. A power electronics module according to claim 5, wherein the protective cover mediates the connection between the coolant housing and the substrate.

7. A power electronics module according to claim 1, wherein the heat transfer formations are pins and/or fins.

8. A power electronics module according to claim 1, wherein the one or more components are soldered or sintered to the first surface of the substrate.

9. A power electronics module according to claim 2, wherein areas of the first surface of the substrate surrounding the one or more components have an electrically insulating coating-.

10. A power electronics module according to claim 1, wherein the coolant is an isolating fluid.

11. A power electronics module according to claim 1, wherein the coolant housing is sealingly connected to the substrate around a perimeter of the void.

12. A plurality of power electronics modules according to claim 1, each power electronics module having a respective substrate, a shared unitary coolant housing forming a plurality of respective voids over the heat transfer formations of the second surfaces of the substrates.

13. A power electronics module according to claim 12, wherein the unitary coolant housing is configured such that the coolant flows in series between the voids from the inlet to the outlet.

14. An electric starter-generator for an aircraft engine, the starter-generator having the power electronics module according to claim 1 or a plurality of power electronics modules, each power electronics module having a respective substrate, a shared unitary coolant housing forming a plurality of respective voids over the heat transfer formations of the second surfaces of the substrates.

15. A power electronics module comprising one or more power converter semiconductor components;
a first single layer substrate having a first surface to which a first component is mounted, and having an opposing second surface from which project a plurality of heat transfer formations for enhancing heat transfer from the substrate; and
a second single layer substrate having a first surface to which a second component is mounted, and having an opposing second surface from which project a plurality of heat transfer formations for enhancing heat transfer from the substrate; and
a coolant housing which defines with the first substrate a first void over the heat transfer formations of the second surface of the first substrate, and which defines with the second substrate a second void over the heat transfer formations of the second surface of the second substrate the coolant housing having an inlet for directing a flow of an electrically insulating coolant into the first and second voids and an outlet for removing the coolant flow from the first and second voids, whereby heat generated during operation of the one or more components is transferred into the coolant flow via the substrate.

16. A power electronics module according to claim 15, wherein the first substrate has a voltage in use and the second substrate has a voltage in use, wherein the voltage of the first substrate is greater than the voltage of the second substrate.

17. A power electronics module according to claim 16, wherein the coolant housing is formed of an electrical insulator.

18. A power electronics module according to claim 16, wherein the coolant housing connected to the substrate via an electrically insulating gasket which electrically isolates the housing from the substrate.

19. A power electronics module according to claim 15, wherein the one or more components are directly soldered or sintered to the first surface of the substrate or directly adhered to the first surface of the substrate by a thermally and electrically conductive adhesive.

20. A power electronics module according to claim 1, wherein the single layer of metallic or metal matrix composite material is one of copper, aluminium, or a metal matrix composite.

* * * * *